(12) United States Patent
Sakamoto

(10) Patent No.: US 9,978,662 B2
(45) Date of Patent: May 22, 2018

(54) SEMICONDUCTOR DEVICE AND MANUFACTURING METHOD FOR SAME

(71) Applicant: Mitsubishi Electric Corporation, Tokyo (JP)

(72) Inventor: Ken Sakamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days. days.

(21) Appl. No.: 14/889,482

(22) PCT Filed: Sep. 11, 2013

(86) PCT No.: PCT/JP2013/074467
§ 371 (c)(1),
(2) Date: Nov. 6, 2015

(87) PCT Pub. No.: WO2015/037072
PCT Pub. Date: Mar. 19, 2015

(65) Prior Publication Data
US 2016/0079143 A1  Mar. 17, 2016

(51) Int. Cl.
*H01L 23/367* (2006.01)
*H01L 21/48* (2006.01)
(Continued)

(52) U.S. Cl.
CPC ...... *H01L 23/3675* (2013.01); *H01L 21/4878* (2013.01); *H01L 21/4882* (2013.01);
(Continued)

(58) Field of Classification Search
CPC ............. H01L 23/3675; H01L 23/3107; H01L 23/3735; H01L 21/565; H01L 21/4882
See application file for complete search history.

(56) References Cited

U.S. PATENT DOCUMENTS 4,583,283 A * 4/1986 Dubois .............. G01N 29/0627
257/675
7,151,311 B2  12/2006 Nakajima et al.
(Continued)

FOREIGN PATENT DOCUMENTS

CN  1499619 A  5/2004
JP  59-67944    5/1984
(Continued)

OTHER PUBLICATIONS

English Machine Translation of JP 59-67944 submitted by Applicants on the IDS dated Nov. 6, 2015.*
(Continued)

*Primary Examiner* — Peniel M Gumedzoe
(74) *Attorney, Agent, or Firm* — Studebaker & Brackett PC

(57) ABSTRACT

In the present invention, a heat spreader has a sagging surface or a C surface being a chamfered portion at an outer peripheral end portion of a back surface thereof. A plurality of power elements formed into chips are mounted on a surface of the heat spreader with a solder therebetween, and an insulating sheet portion is located on the back surface side of the heat spreader. The insulating sheet portion has a laminated structure of an insulating layer and a metal foil, and the insulating layer being the upper layer is closely bonded to the back surface of the heat spreader. A space region between the sagging surface and the insulating sheet portion is filled with a molding resin.

6 Claims, 10 Drawing Sheets

(51) Int. Cl.
*H01L 21/56* (2006.01)
*H01L 23/31* (2006.01)
*H01L 23/373* (2006.01)
*H01L 23/16* (2006.01)
*H01L 23/433* (2006.01)

(52) U.S. Cl.
CPC ............ *H01L 21/565* (2013.01); *H01L 23/16* (2013.01); *H01L 23/3107* (2013.01); *H01L 23/3735* (2013.01); *H01L 23/433* (2013.01); *H01L 23/4334* (2013.01); *H01L 23/367* (2013.01); *H01L 2224/48091* (2013.01); *H01L 2224/48137* (2013.01); *H01L 2224/48139* (2013.01); *H01L 2224/48247* (2013.01); *H01L 2224/49109* (2013.01); *H01L 2224/49111* (2013.01); *H01L 2224/49175* (2013.01); *H01L 2224/73265* (2013.01); *H01L 2924/181* (2013.01)

(56) References Cited

U.S. PATENT DOCUMENTS

| | | | |
|---|---|---|---|
| 2004/0089928 | A1 | 5/2004 | Nakajima et al. |
| 2006/0199309 | A1* | 9/2006 | Sommer ............ H01L 23/3732 438/122 |
| 2009/0224398 | A1* | 9/2009 | Noritake ............... H01L 23/051 257/707 |
| 2012/0230001 | A1* | 9/2012 | Takahashi ........... H01L 23/3128 361/808 |
| 2014/0353814 | A1 | 12/2014 | Sakamoto et al. |

FOREIGN PATENT DOCUMENTS

| | | |
|---|---|---|
| JP | S6233329 Y2 | 8/1987 |
| JP | 2-114943 | 9/1990 |
| JP | 09-064248 | 3/1997 |
| JP | 2004-165281 | 6/2004 |
| JP | 2008-028006 | 2/2008 |
| JP | 2009-212269 | 9/2009 |
| JP | 2011-009410 | 1/2011 |
| KR | 10-2004-0041486 A | 5/2004 |
| WO | 2013124988 A1 | 8/2013 |

OTHER PUBLICATIONS

An Office Action; "Notification of Reason(s) for Refusal," issued by the Japanese Patent Office dated Jun. 7, 2016, which corresponds to Japanese Patent Application No. 2015-536345 and is related to U.S. Appl. No. 14/889,482; with English language partial translation.

Notification Concerning Transmittal of International Preliminary Report on Patentability and Translation of Written Opinion of the International Searching Authority; PCT/JP2013/074467 dated Mar. 24, 2016.

International Search Report, PCT/JP2013/074467, dated Dec. 10, 2013.

An Office Action issued by the Korean Patent Office dated Jul. 11, 2017, which corresponds to Korean Patent Application No. 10-2016-7006359 and is related to U.S. Appl. No. 14/889,482; with English language translation.

An Office Action; "Notification of Decision of Refusal" issued by the Japanese Patent Office dated Nov. 29, 2016, which corresponds to Japanese Patent Application No. 2015-536345 and is related to U.S. Appl. No. 14/889,482; with English language translation.

An Office Action; "Notice of Reasons for Refusal," issued by the Japanese Patent Office dated Dec. 5, 2017, which corresponds to Japanese Patent Application No. 2015-536345 and is related to U.S. Appl. No. 14/889,482; with English language translation.

An Office Action issued by Chinese Patent Office dated Oct. 20, 2017, which corresponds to Chinese Patent Application No. 201380079555.3 and is related to U.S. Appl. No. 14/889,482.

\* cited by examiner

F I G . 1
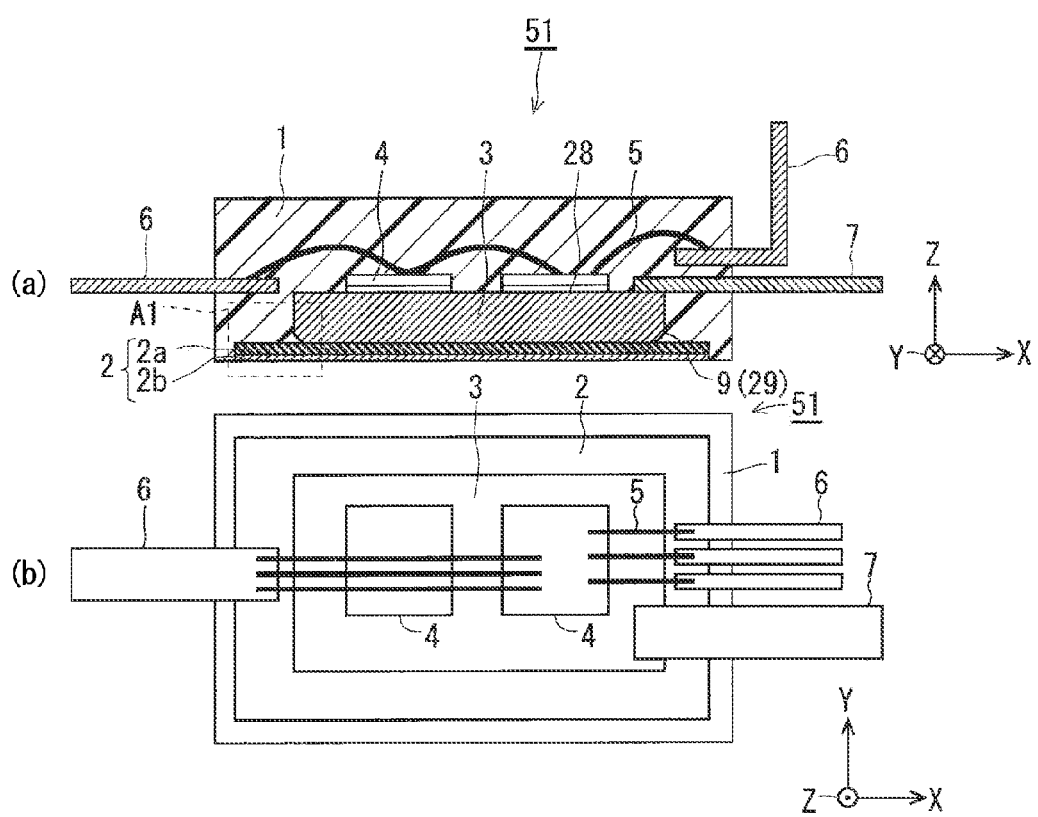

F I G . 3
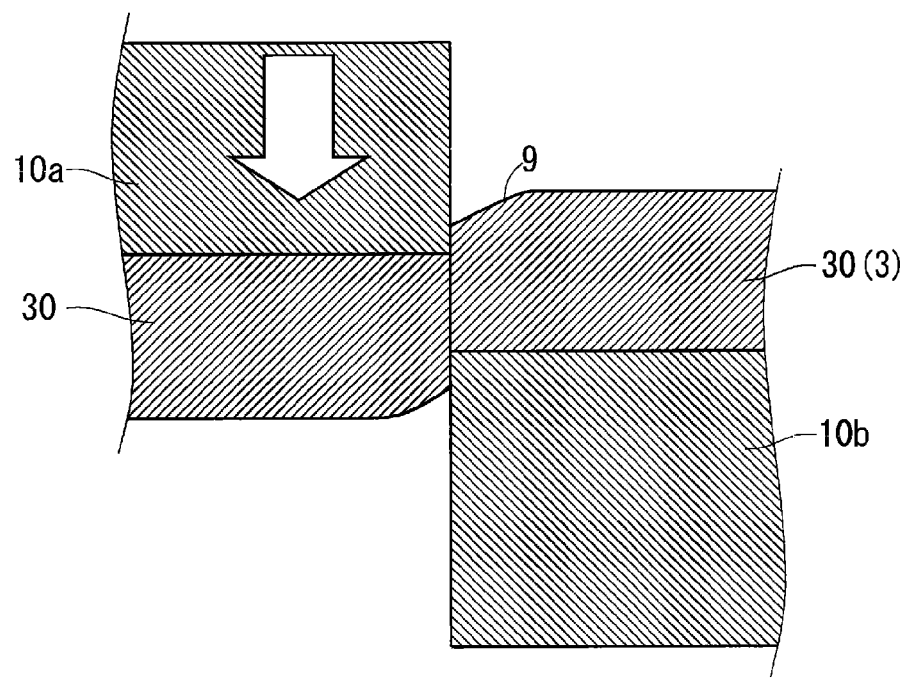

FIG. 4
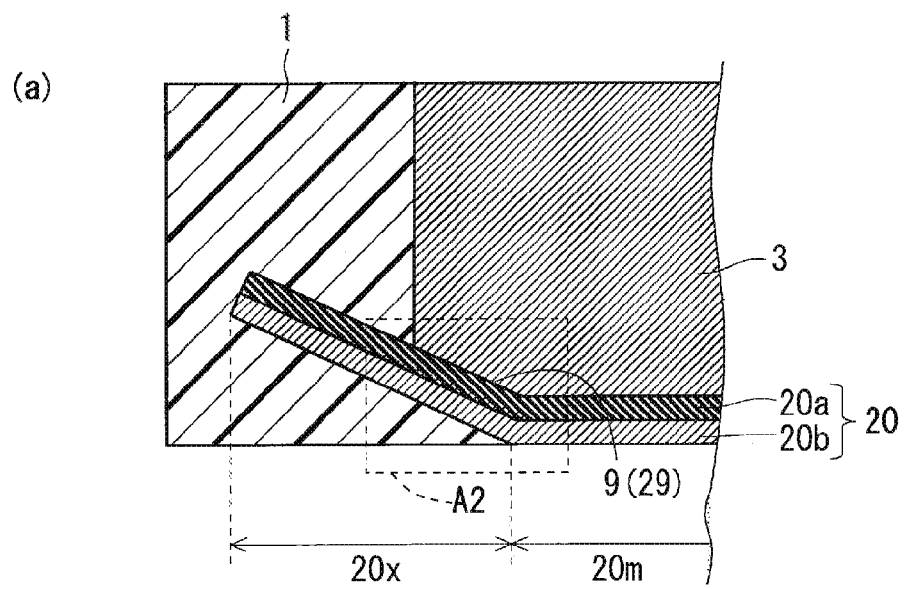
(a)
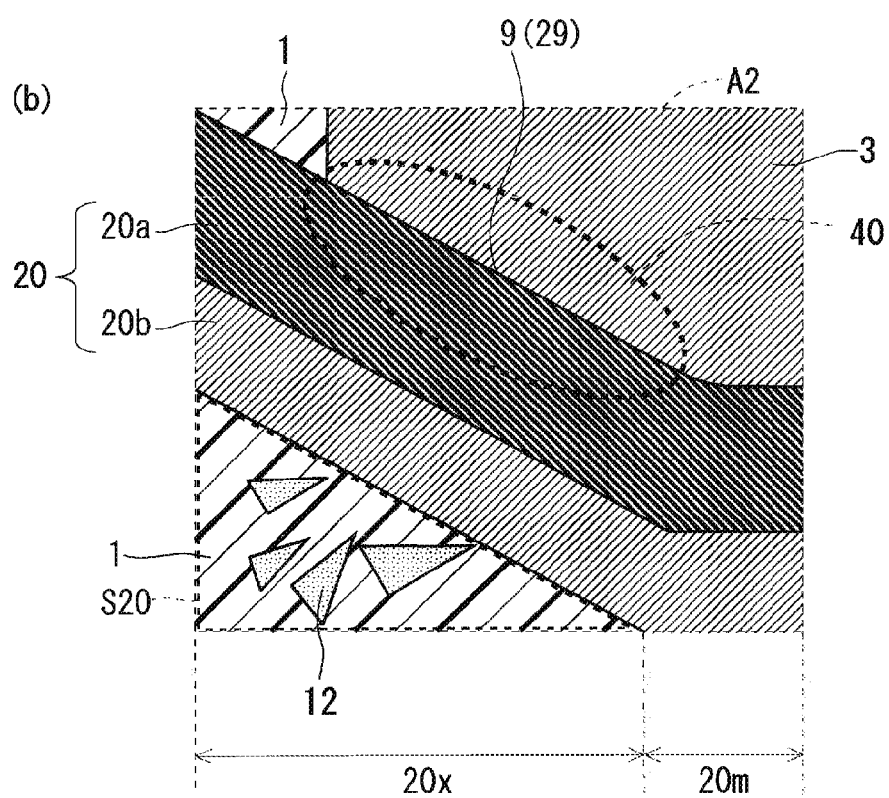
(b)

FIG. 14
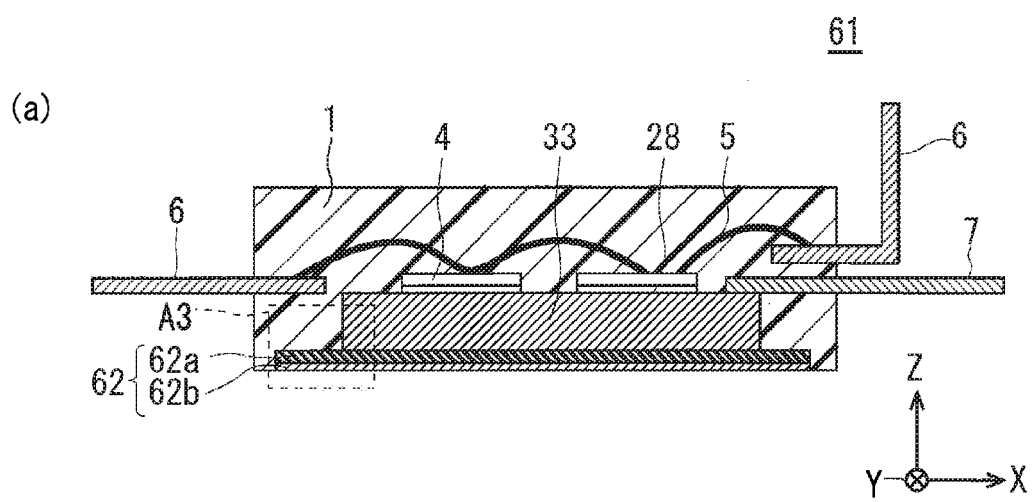
(a)
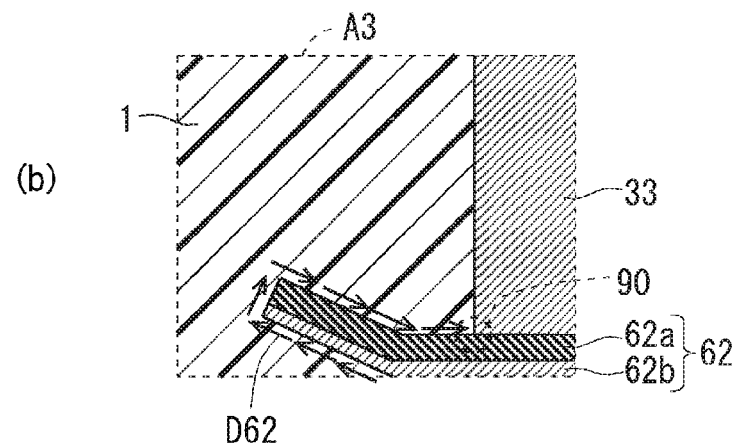
(b)

US 9,978,662 B2

SEMICONDUCTOR DEVICE AND MANUFACTURING METHOD FOR SAME

TECHNICAL FIELD

The present invention relates to a semiconductor device sealed with resin and a method for manufacturing the semiconductor device, and more particularly, to a semiconductor device including an insulating layer having a thermal conductivity higher than that of a sealing resin and a method for manufacturing the semiconductor device.

BACKGROUND ART

It is extremely important that power semiconductor devices keep high insulation properties while efficiently dissipating heat generated by power chips to the outside. An insulating layer located below the power chips is preferably thin to increase heat dissipation characteristics, but it is feared that the thin insulating layer reduces the insulation properties.

Moreover, the power semiconductor devices often adopt semiconductor devices having a resin-sealed structure entirely full-molded with one type of resin. For example, Patent Document 1 discloses a semiconductor module as a semiconductor device having a resin-sealed structure.

PRIOR ART DOCUMENT

Patent Document

Patent Document 1: Japanese Patent Application Laid-Open No. 2011-9410

SUMMARY OF INVENTION

Problems to be Solved by the Invention

In the semiconductor device having the resin-sealed structure entirely full-molded with the one type of resin, however, the sealing resin is also used for an insulating layer under a heat spreader, the insulating layer being bonded to the heat spreader such as a metal block. Thus, when the insulating layer under the heat spreader has a thin thickness, the resin does not sufficiently enter a region in which the insulating layer under the heat spreader is formed, and an extreme decline in mold characteristics thus results in extreme difficulty of thinning the insulating layer under the heat spreader.

Therefore, the insulating layer needs to have a thick thickness to some extent, which reduces heat dissipation characteristics. A resin having an excellent thermal conductivity is conceivably used for the insulating layer in order to increase the heat dissipation characteristics while the insulating layer has the thick thickness to some extent. However, the resin having the excellent thermal conductivity is expensive, so that using the expensive high-performance resin as a structural material for the insulating layer increases costs.

As the semiconductor module disclosed in Patent Document 1, in addition to a sealing resin, an insulating sheet portion under a heat spreader having a structure formed of a laminated structure of an insulating layer and a metal layer (metal foil) having high thermoelectric performance is conceivable, but the structure fails to have high insulation properties.

The present invention has been made in view of the above mentioned problems, and an object thereof is to provide a semiconductor device that can be formed at a relatively low cost and has a resin-sealed structure having high insulation properties and to provide a method for manufacturing the semiconductor device.

Means to Solve the Problems

A semiconductor device according to a first aspect of the present invention having a structure in which a semiconductor element is sealed with a molding resin includes: a heat spreader having a surface on which the semiconductor element is mounted; and an insulating sheet portion located on a back surface of the heat spreader. The insulating sheet portion has a laminated structure of an insulating layer having a thermal conductivity higher than that of the molding resin and a metal layer, the insulating layer being closely bonded to the back surface of the heat spreader. The heat spreader has a chamfered portion obtained by R chamfering or C chamfering at an outer peripheral end portion of the back surface thereof. The insulating sheet portion is formed so as to have the same plane along the back surface of the heat spreader, a space region being provided between the chamfered portion and the insulating sheet portion. The molding resin seals the semiconductor element, the heat spreader, and the insulating sheet portion except for a back surface of the metal layer.

A semiconductor device according to a second aspect of the present invention having a structure in which a semiconductor element is sealed with a molding resin includes: a heat spreader having a surface on which the semiconductor element is mounted; and an insulating sheet portion located on a back surface of the heat spreader. The insulating sheet portion has a laminated structure of an insulating layer having a thermal conductivity higher than that of the molding resin and a metal layer, the insulating layer being closely bonded to the back surface of the heat spreader. The heat spreader has a chamfered portion obtained by R chamfering or C chamfering at an outer peripheral end portion of the back surface thereof. The insulating sheet portion has a main body portion and a bent portion, the main body portion forming the same plane along the back surface of the heat spreader, the bent portion having a surface region formed so as to be bent from the main body portion and being closely bonded to the chamfered portion. The molding resin seals the semiconductor element, the heat spreader, and the insulating sheet portion except for a back surface of the metal layer in the main body portion.

Effects of the Invention

In the semiconductor device according to the first aspect of the present invention, an electric field concentrated place in the heat spreader is distributed to a plurality of electric field concentrated places by the chamfered portion located at the outer peripheral end portion of the back surface of the heat spreader, to thereby reduce a density of the electric fields, and thus insulation properties can be improved. As a result, the semiconductor device having high insulation properties can be obtained even in a case where it is feared that a temperature rise or the like during an operation of the semiconductor element causes the insulating layer to reduce the insulation properties.

Moreover, the insulating sheet portion is formed so as to have the same plane, so that R obtained by the R chamfering or C obtained by the C chamfering is set to a dimension that does not interfere with filling the space region with the molding resin to form the chamfered portion, which allows the space region between the chamfered portion and the insulating sheet portion (insulating layer) to be filled with the molding resin. As a result, the semiconductor device having excellent heat dissipation characteristics and excellent insulation properties can be obtained at a relatively low cost.

The semiconductor device according to the second aspect of the present invention has the structure without the space region between the insulating sheet portion and the chamfered portion by closely bonding the bent portion of the insulating sheet portion to the chamfered portion of the heat spreader, to thereby eliminate room for voids formed in the space region, the voids being a factor in electric discharge. This can reduce a heat resistance between the heat spreader and the molding resin and improve the insulation properties.

These and other objects, features, aspects and advantages of the present invention will become more apparent from the following detailed description of the present invention when taken in conjunction with the accompanying drawings.

BRIEF DESCRIPTION OF DRAWINGS

FIG. 1 is an explanatory diagram showing a structure of a semiconductor device being a first embodiment of the present invention.

FIG. 3 is a cross-sectional view schematically showing a rupturing process of forming a sagging surface on the heat spreader in the first embodiment.

FIG. 4 is an explanatory diagram schematically showing a surrounding structure of a chamfered portion of a heat spreader in a semiconductor device being a second embodiment.

FIG. 14 is an explanatory diagram showing a cross-sectional structure of a semiconductor device in an underlying technology.

DESCRIPTION OF EMBODIMENTS (Underlying Technology)

Figure 2:
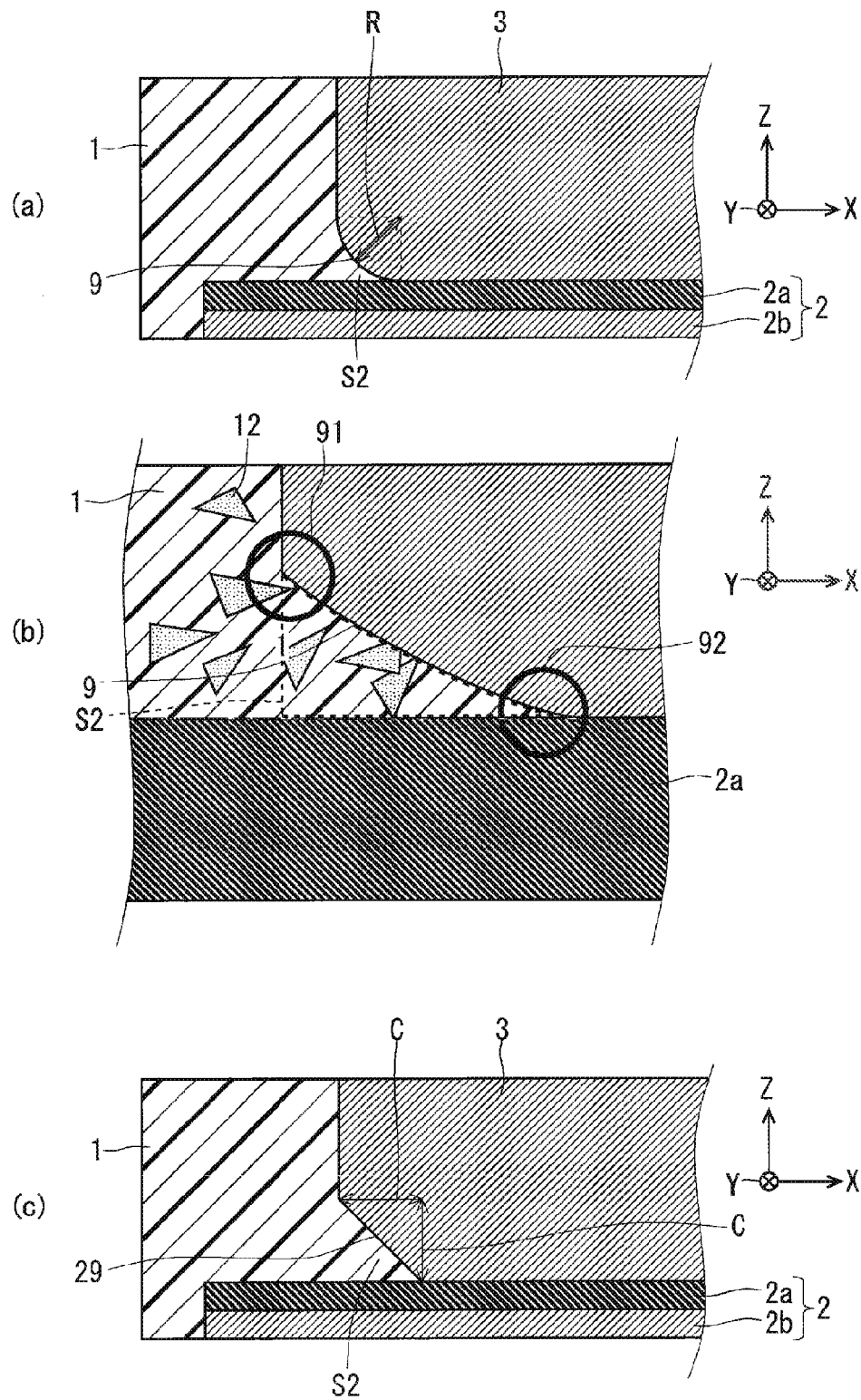
FIG. 2 is an explanatory diagram schematically showing a surrounding structure of a chamfered portion of a heat spreader shown in FIG. 1.

As described above, the insulating material such as the high-performance resin having the excellent thermal conductivity is used for the insulating layer in the conventional semiconductor device having the resin-sealed structure, which increases costs. For this reason, an insulating sheet portion has a laminated structure of an insulating layer and a metal layer (metal foil) having high thermoelectric performance as the semiconductor module disclosed in Patent Document 1, and an insulating material having a relatively thin thickness and a great thermal conductivity is used for the insulating layer, so that a laminated-structure insulating method in which securing insulation is easily compatible with high heat dissipation characteristics without greatly increasing costs is conceivable.

The laminated-structure insulating method forms the insulating layer made of the high-performance insulating material having the excellent thermal conductivity only directly below a necessary region, namely, a heat spreader having a surface on which semiconductor elements are mounted, so that it is a cost advantage.

FIG. 14 is an explanatory diagram showing a cross-sectional structure of a typical semiconductor device 61 (semiconductor module) obtained by the laminated-structure insulating method. Part (a) of FIG. 14 is a cross-sectional view of the whole semiconductor device 61, and part (b) of FIG. 14 is an enlarged diagram of a focused region A3 in part (a) of FIG. 14. In addition, part (a) of FIG. 14 is provided with an XYZ Cartesian coordinate system.

As shown in part (a) of FIG. 14, power elements 4 being a plurality of (two) semiconductor elements formed into chips are mounted on a surface of a heat spreader 33 with a solder 28 therebetween, and aluminum wires 5 are connected between the plurality of power elements 4 and between the power elements 4 and signal terminals 6. Moreover, a main terminal 7 is directly located on the surface of the heat spreader 33.

An insulating sheet portion 62 is located on a back surface side of the heat spreader 33. The insulating sheet portion 62 has a laminated structure of an insulating layer 62a and a metal foil 62b, and a surface of the insulating layer 62a is closely bonded to the back surface of the heat spreader 33.

The insulating sheet portion 62 except for a back surface of the metal foil 62b, the heat spreader 33, the power elements 4, the whole aluminum wires 5, part of the signal terminals 6, and part of the main terminal 7 are sealed with a molding resin 1, to thereby form the semiconductor device 61. In addition, a back surface of the insulating sheet portion 62, namely, the back surface of the metal foil 62b is exposed.

The semiconductor device 61 shown in part (a) of FIG. 14 has a problem in which moisture enters a bonding interface between the molding resin 1 that integrally seals the package and the insulating sheet portion 62 in an environment at high temperature and high humidity, and a path having high conductivity is formed between the heat spreader 33 and the metal foil 62b having the back surface exposed, thereby causing dielectric breakdown. A place in which the dielectric breakdown is likely to occur is directly below an outer peripheral end portion of the back surface of the heat spreader 33. The reason is that the outer peripheral end portion of the back surface of the heat spreader 33 is close to an inlet of moisture on the bottom surface of the semiconductor device 61 and has a sharp electrode structure, so that electric lines of force are concentrated, increasing a density of electric fields.

To solve the problem of the dielectric breakdown, as shown in part (b) of FIG. 14, an edge portion of the insulating sheet portion 62 is bent, and the portion directly below the edge portion of the metal foil 62b is also filled with the molding resin 1 that is strongly bonded to the metal foil 62b. This doubles a distance D62 of a moisture absorption path for moisture entering from the outside air, and thus the moisture hardly reaches the outer peripheral end portion of the heat spreader 33 even in the environment at high temperature and high humidity, which hardly causes the dielectric breakdown, and consequently, reliability of the semiconductor device 61 is conceivably increased. The moisture absorption path has the distance D62 approximately twice as long as the conventional distance because the moisture absorption path includes the back surface portion of the bent metal foil 62b.

However, as described above, the outer peripheral end portion of the bottom surface of the heat spreader 33 forms an acute angle of approximately 90° in the XZ plane in FIG. 14, so that a density of the electric lines of force is increased upon application of voltage to the portion between the heat spreader 33 and the metal foil 62b with the insulating layer 62a therebetween, and the electric fields are easily concentrated at an electric field concentrated place 90 formed of the outer peripheral end portion of the bottom surface of the heat spreader 33 and the surrounding region, resulting in deterioration of insulation properties.

Embodiments described below solve the problems of the underlying technology described above and are a semiconductor device that has high insulation properties at a relatively low cost and a method for manufacturing the semiconductor device.

First Embodiment (Structure)

FIG. 1 is an explanatory diagram showing a structure of a semiconductor device 51 being a first embodiment of the present invention. Part (a) of FIG. 1 is a cross-sectional view showing a cross-sectional structure, and part (b) of FIG. 1 is a plan view showing a planar structure. In addition, parts (a), (b) of FIG. 1 are each provided with the XYZ Cartesian coordinate system.

As shown in FIG. 1, a plurality of (two) power elements 4 formed into chips are mounted on a surface of a heat spreader 3 with a solder 28 therebetween. Aluminum wires 5 are connected between the plurality of power elements 4 and between the power elements 4 and signal terminals 6. A material for the heat spreader 3 is preferably metals such as aluminum and copper that are easily processed and have a high thermal conductivity.

An insulating sheet portion 2 is located on a back surface side of the heat spreader 3. The insulating sheet portion 2 has a laminated structure of an insulating layer 2a and a metal foil 2b (metal layer), and a surface of the insulating layer 2a being the upper layer is closely bonded to the back surface of the heat spreader 3. The insulating layer 2a has a thermal conductivity higher than that of a molding resin 1 and has high insulation properties.

The insulating sheet portion 2 except for a back surface of the metal foil 2b, the heat spreader 3, the power elements 4, the whole aluminum wires 5, part of the signal terminals 6, and part of a main terminal 7 are sealed with the molding resin 1, to thereby form the semiconductor device 51 in the first embodiment. In addition, a portion except for the part of the signal terminals 6 and the main terminal 7 and the back surface of the insulating sheet portion 2 are not sealed with the molding resin 1. Therefore, the back surface of the metal foil 2b is exposed.

In the semiconductor device 51 in the first embodiment, an outer peripheral end portion of the back surface of the heat spreader 3 has a chamfered portion obtained by R chamfering or C chamfering.

FIG. 2 is an explanatory diagram schematically showing a surrounding structure of the chamfered portion of the heat spreader 3. As shown in part (a) of FIG. 2, a sagging surface 9 (R surface) that has a radius R (radius) and is obtained by the R chamfering is formed as a chamfered portion. On the other hand, as shown in part (c) of FIG. 2, a C surface 29 that has a chamfering length C (chamfering) and is obtained by the C chamfering is formed as a chamfered portion. As shown in parts (a), (c) of FIG. 2, one surface of the sagging surface 9 and the C surface 29 is adopted as the chamfered portion.

Hereinafter, a chamfered portion described in the specification is described. The chamfered portion is a surface obtained by cutting an end portion of a vertical plane (XY plane shown in FIGS. 1 and 2) being a cross-sectional formation surface of the heat spreader 3, and the sagging surface 9 and the C surface 29 described above are conceivable.

The sagging surface 9 has a curvature represented by an arc shape, and the number represents where the center is. For example, in a case where R shown in part (a) of FIG. 2 is 10 μm, a curved surface that has an arc with the center located 10 μm inside from the point starting to be curved is the sagging surface 9.

On the other hand, the C surface 29 is a surface obtained by cutting a corner inwardly from a tip portion of the corner. For example, in a case where C shown in part (a) of FIG. 2 is 10 μm, the C surface 29 is obtained by cutting an isosceles right triangle having a side of 10 μm from the corner.

Meanwhile, the insulating sheet portion 2 (insulating layer 2a and metal foil 2b) is formed so as to have the same plane without being bent, so that the back surface of the heat spreader 3 except for the sagging surface 9 and the surface of the insulating layer 2a are closely bonded together, and a space region S2 that can be filled with the molding resin 1 is located between the sagging surface 9 (C surface 29) and the insulating sheet portion 2 (insulating layer 2a).

As shown in part (b) of FIG. 2, the sagging surface 9 (C surface 29) is located at the end portion of the bottom surface of the heat spreader 3, and sharpness of the outer peripheral end portion of the heat spreader 3 is thus reduced, thereby distributing the concentration of the electric lines of force at the outer peripheral end portion and reducing the density of the electric fields. Furthermore, the place in which the concentration of the electric fields occur is distributed to both end portions of the sagging surface 9 and electric field concentrated places 91 and 92 around them, so that the density of the electric fields is further reduced. These phenomena relieve the entire concentration of the electric fields, increase breakdown voltage of the insulating layer 2a formed between the electrodes being the metal foil 2b and the heat spreader 3 each having conductivity, and can improve insulation properties of the semiconductor device 51.

In this manner, in the semiconductor device 51 in the first embodiment, for example, the electric field concentrated place in the heat spreader 3 is distributed to the plurality of electric field concentrated places (electric field concentrated places 91, 92) by the chamfered portion (sagging surface 9, C surface 29) located at the outer peripheral end portion of the back surface of the heat spreader 3, to thereby reduce the density of the electric fields, and thus the insulation properties can be improved by the insulating layer 2a.

As a result, the semiconductor device 51 having high insulation properties can be obtained even in a case where it is feared that a temperature rise or the like during an operation of semiconductor elements such as the power elements 4 causes the insulating layer 2a to reduce the insulation properties. This effect is particularly effective because it is feared that an increase in temperature rise of the insulating sheet portion 2 causes the insulating layer 2a to reduce the insulation properties when SiC chips formed of the semiconductor elements such as the power elements 4 including SiC are mounted on the heat spreader 3.

Moreover, the insulating sheet portion 2 is formed so as to have the same plane, and thus, as described below, R obtained by the R chamfering or C obtained by the C chamfering is set to a dimension that does not interfere with filling in the space region S2 with the sealing resin, which allows the space region S2 to be reliably filled with the molding resin 1. As a result, the semiconductor device 51 having excellent heat dissipation characteristics and excellent insulation properties can be obtained.

Hereinafter, particular settings of dimensions of R obtained by the R chamfering and C obtained by the C chamfering are described. R is preferably 100 to 300 µm when the sagging surface 9 is formed. The reason why R is set to 100 µm or more is that the space region S2 can be filled with the molding resin 1 without problems and molding pressure can be sufficiently applied to the molding resin 1 during a transfer mold process on the assumption that a filler 12 in the molding resin 1 has a size of approximately 50 µm.

On the other hand, in a case where R is sufficiently smaller than 100 µm, packing properties of the filler 12 prevent the space region S2 from being filled with the molding resin 1 and at least part of the space region S2 is not filled, so that the molding pressure is not sufficiently applied during the transfer mold process. As a result, the possibility of occurrence of voids in the space region S2 increases. For the same reason, C is preferably 100 µm or more when the C surface 29 is formed.

The semiconductor device 51 having the high-stability structure in which the space region S2 is filled with the molding resin 1 without problems can be obtained by setting the dimensions of R and C of the sagging surface 9 and the C surface 29, respectively, as described above.

(Manufacturing Method)

The semiconductor device 51 in the first embodiment can be manufactured by a method for manufacturing a semiconductor device including steps (a) to (c) below.

Step (a): The heat spreader 3 having the surface on which the power elements 4 are mounted by bonding with the solder 28 is prepared. At this time, a step (a-1) below is performed.

Step (a-1): A rupturing process with punching dies is performed, and the chamfered portion (sagging surface 9, C surface 29) obtained by the R chamfering or the C chamfering is formed at the outer peripheral end portion of the back surface of the heat spreader 3.

In addition, the step (a) includes the existing step below. After the power elements 4 are bonded to frames (portions forming the signal terminals 6 and the main terminal 7) with a solder, the aluminum wires 5 are bonded between the power elements 4, between the power elements 4 and the frames, and between the frames, to thereby obtain a mounted frame structure. An aspect in which the heat spreader 3 is bonded to the power elements 4 with the solder 28 through the frames is also conceivable.

Step (b): The insulating sheet portion 2 formed of the insulating layer 2a and the metal foil 2b is prepared.

Step (c): The transfer mold process of sealing, with the molding resin 1, the insulating sheet portion 2 except for the back surface of the metal foil 2b, the heat spreader 3, the power elements 4, the whole aluminum wires 5, the part of the signal terminals 6, and the part of the main terminal 7 is performed. Hereinafter, the details of the transfer mold process are described.

After the insulating sheet portion 2 is disposed in a cavity formed of dies (upper die, lower die), the mounted frame structure completed up to a wire bonding step is set in a predetermined position in the cavity, and subsequent to mold clamping, a transfer mold technique injects the molding resin 1 to fill the cavity in the dies and cures the molding resin 1 and the insulating sheet portion 2 by the application of heat and pressure. As a result, the insulating layer 2a is closely bonded to the back surface of the heat spreader 3 (except for the chamfered portion), and the resin-sealed semiconductor device structure can be obtained, the structure including each structural portion 2 to 7 sealed with the molding resin 1.

After the step (c), subsequent processes below are performed. In other words, cutting excess portions of the frames such as tie bars, molding lead terminals (signal terminals 6, main terminal 7), testing a product, or the like are performed after the heating step of completely curing the molding resin 1, and then the semiconductor device 51 as the product is completed.

FIG. 3 is a cross-sectional view schematically showing the rupturing process of forming the sagging surface 9 in the step (a-1) described above.

As shown in FIG. 3, a heat spreader material 30 that is located between an upper die 10a and a lower die 10b for punching and has a flat-plate structure is punched by pressing the upper die 10a down, so that the heat spreader 3 having the sagging surface 9 can be obtained.

In this manner, the rupturing process with the dies 10a, 10b for punching is performed, and the chamfered portion (sagging surface 9, C surface 29) obtained by the R chamfering or the C chamfering can be formed at the outer peripheral end portion of the back surface of the heat spreader 3.

In addition, the determination of R and C by the R chamfering and the C chamfering respectively can be achieved by the rupturing process with the punching dies 10a, 10b described above and the existing technique for adjusting a clearance, using a special tool, or the like.

For example, increasing a clearance between the die 10a and the die 10b for punching in manufacturing the heat spreader 3 allows for a process of increasing R being an amount of sag. The clearance between the punching 10a, 10b is preferably great, and the sagging surface 9, the C surface 29 do not need to be reduced in size more than necessary, which can save a cost of replacement blades due to wear of the dies 10a, 10b and time of maintenance. This leads to the merit of no cost.

As described above, setting R in the range of 100 to 300 µm can suppress a burr to 10 µm or less, the burr occurring at the outer peripheral end portion of the back surface of the heat spreader 3 after punching.

In this manner, the existing rupturing process is performed to obtain the insulating sheet portion 2 having the chamfered portion (sagging surface 9, C surface 29), and thus the semiconductor device 51 in the first embodiment can be manufactured at a relatively low cost.

Second Embodiment (Structure)

FIG. 4 is an explanatory diagram schematically showing a surrounding structure of a chamfered portion of a heat spreader 3 in a semiconductor device 52 being a second embodiment. A structure shown in part (a) of FIG. 4 corresponds to the focused region A1 in the semiconductor device 51 shown in FIG. 1, and a structure shown in part (b) of FIG. 4 is an enlarged diagram of a focused region in part (a) of FIG. 4.

As shown in FIG. 4, an insulating sheet portion 20 is located on a back surface side of the heat spreader 3. The insulating sheet portion 20 has a laminated structure of an insulating layer 20a and a metal foil 20b (metal layer), and a surface of the insulating layer 20a is closely bonded to the back surface of the heat spreader 3 having a sagging surface 9. The insulating layer 20a has a thermal conductivity higher than that of a molding resin 1 and has high insulation properties.

In this manner, the insulating sheet portion 20 has a main body portion 20m and a bent portion 20x, the main body portion 20m forming the same plane along the back surface of the heat spreader 3 (except for the sagging surface 9), the bent portion 20x being formed so as to be bent from the main body portion 20m and being closely bonded to the sagging surface 9. The insulating layer 20a and the metal foil 20b are each formed so as to have the same thickness in the main body portion 20m and the bent portion 20x, that is to say, the insulating sheet portion 20 having the bent portion 20x is formed so as to have the uniform thickness. The insulating layer 20a and the metal foil 20b are each preferably formed of a material that does not allow deformation and breakage of the bent portion 20x by a flow of the molding resin 1 during a transfer mold process.

FIG. 4 shows the sagging surface 9 as the chamfered portion formed at an end portion of the back surface of the heat spreader 3, but the C surface 29 may be provided instead of the sagging surface 9 similarly to the first embodiment, and in this case, the insulating sheet portion 20 has a structure in which the bent portion 20x is closely bonded to the C surface 29.

As described above, in the semiconductor device 52 in the second embodiment, the bent portion 20x of the insulating sheet portion 20 (insulating layer 20a) is closely bonded to the sagging surface 9 (C surface 29) of the heat spreader 3, to thereby reliably prevent the phenomenon in which the molding resin 1 enters the portion directly below the sagging surface 9 during the transfer mold process. Therefore, the semiconductor device 52 having the structure without voids directly below the sagging surface 9 with reliability can be obtained.

The bent portion 20x of the insulating sheet portion 20 is closely bonded to the chamfered portion (sagging surface 9, C surface 29) of the heat spreader 3, so that the semiconductor device 52 in the second embodiment has the structure without the space region S2 (see FIG. 2), which is provided in the semiconductor device 51 in the first embodiment, between the insulating sheet portion 20 and the chamfered portion. Therefore, the semiconductor device 52 that reduces a heat resistance between the heat spreader 3 and the molding resin 1 and has improved insulation properties can be obtained by reliably eliminating room for voids formed in the space region S2, the voids being a factor in electric discharge.

The semiconductor device 52 in the second embodiment has the insulation properties improved in this manner, and even in a case where voltage is applied to the semiconductor device 52 for a long time as in actual use, the semiconductor device 52 has reliability improved, allowing for extended lifetime.

As described above, the insulating sheet portion 20 having the bent portion 20x is formed so as to have the uniform thickness, so that a below-insulating-sheet-portion space region S20 formed below the bent portion 20x of the insulating sheet portion 20 (metal foil 20b) below the chamfered portion (sagging surface 9, C surface 29) is formed as shown in part (b) of FIG. 4. Therefore, the below-insulating-sheet-portion space region S20 is filled with the molding resin 1, and thus the molding resin 1 and the insulating sheet portion 20 have a bonding area increased therebetween. As a result, peeling between the insulating layer 20a and the metal foil 20b in the insulating sheet portion 20 and between the insulating sheet portion 20 and the molding resin 1 hardly occurs, so that the reliability can be improved.

Hereinafter, this point is described in detail. As described above, the bonding area between the molding resin 1 and the insulating sheet portion 20 is increased, thereby improving the adhesion of the interface between the insulating layer 20a and the metal foil 20b and the adhesion of the interface between the insulating sheet portion 20 and the molding resin 1. Therefore, a rate of failures due to the insulation properties in a step of testing the semiconductor device 52 after assembly can be reduced. Particularly in an environment of a repeated coldness and hotness atmosphere during actual use, the peeling at the interface between the insulating layer 20a and the metal foil 20b and the peeling at the interface between the insulating layer 20a and the molding resin 1 starting from the edge of the insulating sheet portion 20 caused by the expansion and contraction of the insulating layer 20a, the metal foil, 20b, and the molding resin 1 can be suppressed, allowing for the extended lifetime of the device.

Figure 5:
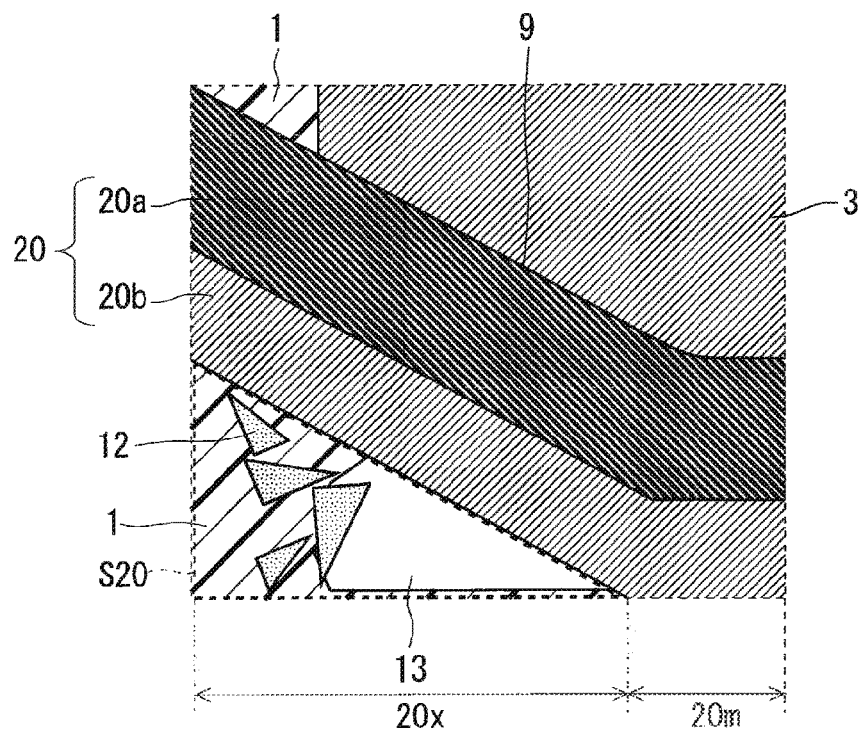
FIG. 5 is an explanatory diagram showing effects of the semiconductor device in the second embodiment.

FIG. 5 is an explanatory diagram showing effects of the semiconductor device 52 in the second embodiment. FIG. 5 corresponds to an enlarged diagram of the focused region A2 in part (a) of FIG. 4.

As shown in FIG. 5, a weld region (a region without application of voltage and without an influence on heat dissipation) being the tip of the flowing molding resin 1 is located directly below the metal foil 20b when the transfer mold process fills the molding resin 1, so that even if a void (hollow) 13 is generated, the void 13 does not adversely affect electrical performance of the semiconductor device 52. Therefore, the semiconductor device 52 can reduce insulation failures and heat dissipation failures when being used in the actual equipment for a long time.

The semiconductor device 52 in the second embodiment similar to the semiconductor device 51 in the first embodiment has dimension characteristics in which the heat spreader 3 has a thickness of 0.5 mm to 5 mm, R is set to 100 μm or more when the sagging surface 9 is obtained as the chamfered portion by the R chamfering, and C is set to 100 μm or more when the C surface 29 is obtained by the C chamfering.

Additionally, the semiconductor device 52 in the second embodiment has the dimension characteristics as described above, so that the below-insulating-sheet-portion space region S20 below the chamfered portion is sufficiently filled with the molding resin 1 on the assumption that a filler 12 generated in the molding resin 1 has a size of approximately 50 μm, and thus molding pressure can be sufficiently applied during the transfer mold process.

As a result, the semiconductor device 52 having the high-stability structure in which the below-insulating-sheet-portion space region S20 is filled with the molding resin 1 without problems can be obtained.

In this manner, the semiconductor device 52 in the second embodiment takes measures against voids inside the molding resin 1, and the semiconductor device 52 similar to the semiconductor device 51 in the first embodiment can reduce troubles and a cost of using high insulating materials (resin) as in the conventional manner.

Figure 6:
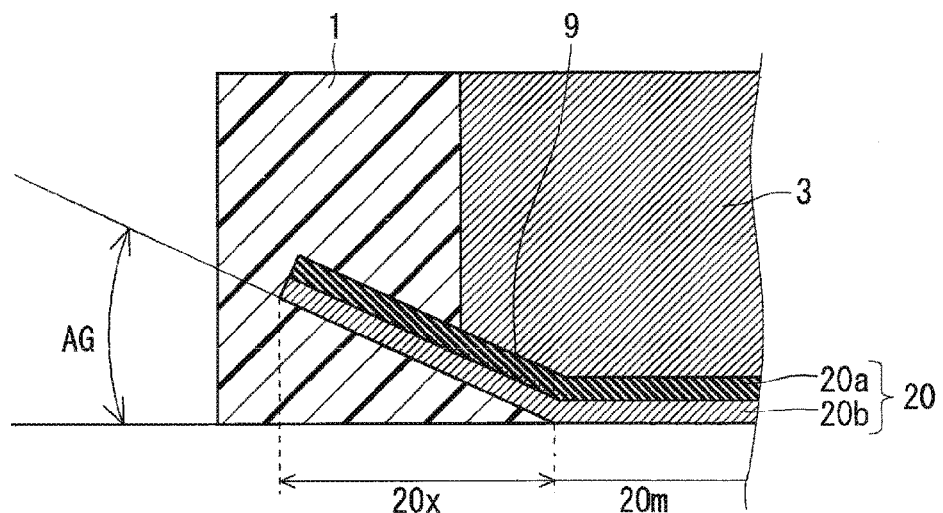
FIG. 6 is an explanatory diagram showing a bending angle of a bent portion to a main body portion in an insulating sheet portion.

FIG. 6 is an explanatory diagram showing a bending angle of the bent portion 20x to the main body portion 20m. As shown in FIG. 6, the bent portion 20x needs to be bent at a bending angle AG to the main body portion 20m in order to be closely bonded to the sagging surface 9 of the heat spreader 3.

At this time, the insulating layer 20a needs to be in a range in which cracks do not occur, so that the bending angle AG is preferably 15° or less for the sagging surface 9 and 45° or less for the C surface 29.

Therefore, when formed by the R chamfering, the sagging surface 9 is preferably formed such that the bending angle AG of the bent portion 20x to the main body portion 20m falls within a range of 10° to 15°, and when formed by the C chamfering, the C surface 29 is preferably formed such that the bending angle AG of the bent portion 20x to the main body portion 20m is 45° or less.

In this manner, when the sagging surface 9 is formed as the chamfered portion, the heat spreader 3 in the semiconductor device 52 is formed such that the angle of the bent portion 20x to the main body portion 20m falls within the range of 10° to 15°. Thus, the adhesion of the sagging surface 9 obtained by the R chamfering to the insulating sheet portion 20 (insulating layer 20a) is satisfied, and the insulating layer 20a obtains the structure without the occurrence of cracks, so that the insulation properties can be highly improved.

Similarly, when the C surface 29 is formed as the chamfered portion, the heat spreader 3 in the semiconductor device 52 is formed such that the angle of the bent portion 20x to the main body portion 20m is 45°, so that the adhesion of the sagging surface 9 obtained by the R chamfering to the insulating sheet portion 20 (insulating layer 20a) is satisfied and the insulating layer 20a obtains the structure without occurrence of cracks, and thus the insulation properties can be highly improved.

(Manufacturing Method)

The semiconductor device 52 in the second embodiment can be manufactured by a method for manufacturing a semiconductor device including steps (a) to (c) below.

Step (a): The heat spreader 3 having the surface on which the power elements 4 are mounted is prepared. At this time, the rupturing process (step (a-1)) similarly to the first embodiment is performed to form the chamfered portion (sagging surface 9, C surface 29). The details of the process including the existing technique in the step (a) are similar to those of the semiconductor device 51 in the first embodiment.

Step (b): The insulating sheet portion 20 (21, 22) formed of the insulating layer 20a (21a, 22a) and the metal foil 20b (21b, 22b) is prepared. The insulating sheet portion 20 prepared in the step (b) has the structure having the same plane as a whole before being processed, namely, the structure without the bent portion 20x (21x, 22x) and the main body portion 20m (21m, 22m) while the insulating sheet portion 20 prepared in the step (b) has the structure after being processed, namely, the structure having the bent portion 20x and the main body portion 20m.

Step (c): The transfer mold process of sealing, with the molding resin 1, the insulating sheet portion 20 except for the back surface of the metal foil 20b in the main body portion 20m, the heat spreader 3, the power elements 4, the whole aluminum wires 5, the part of the signal terminals 6, and the part of the main terminal 7 is performed.

Similarly to the semiconductor device 51 in the first embodiment, subsequent processes are performed after the step (c).

(Bent Portion Forming Process)

Further, in the semiconductor device 52 in the second embodiment, in the case where the step (b) prepares the insulating sheet portion 20 (21) before being processed, a bent portion forming process below to obtain the insulating sheet portion 20 after being processed is performed as a step (c-1) included in the step (c).

Step (c-1): After the insulating sheet portion 20 (21) before being processed is disposed in a cavity formed of dies (upper die, lower die), the mounted frame structure completed up to a wire bonding step is set in a predetermined position in the cavity. Then, a region corresponding to the chamfered portion (sagging surface 9, C surface 29) of the insulating sheet portion 20 before being processed is bent by mold clamping with the dies, and thus the main body portion 20m and the bent portion 20x are formed, the main body portion 20m forming the same plane along the back surface of the heat spreader 3, the bent portion 20x being formed so as to be bent from the main body portion 20m and being closely bonded to chamfered portion.

Subsequently, a transfer mold technique injects the molding resin 1 to fill the cavity in the dies and cures the molding resin 1 and the insulating sheet portion 20 by the application of heat and pressure. As a result, after the transfer mold process in the step (c), the main body portion 20m of the insulating sheet portion 20 is closely bonded to the back surface of the heat spreader 3 except for the chamfered portion, and the bent portion 20x is closely bonded to the chamfered portion of the heat spreader 3.

(First Aspect (Using Insulating Sheet Portion 20 after Being Processed))

A step (b-1) in an early stage of the step (b) prepares the insulating sheet portion 20 having the bent portion 20x that corresponds to the chamfered portion of the heat spreader 3 in advance. In a first aspect, the insulating sheet portion 20 after being processed is obtained without the above-mentioned bent portion forming process.

For the adoption of the first aspect, the transfer mold process is performed after the insulating sheet portion 20 and the mounted frame structure (including the heat spreader 3) are mounted in the cavity formed inside the dies in a positional relationship such that the surface of the insulating layer 20a in the bent portion 20x faces the chamfered portion (sagging surface 9, C surface 29) of the heat spreader 3.

Then, a weld region being the tip of the flowing molding resin 1 enters a below-insulating-sheet-portion space region S20 located below the metal foil 20b forming the bent portion 20x of the insulating sheet portion 20. After completion of the injection of the molding resin 1, when the molding resin 1 is cured while pressure is maintained, the bent portion 20x of the insulating sheet portion 20 (insulating layer 20a) is strongly closely bonded to the sagging surface 9 of the heat spreader 3 and the insulating material forming the insulating layer 20a is also cured, which allows the insulating sheet portion 20 to be in a state of being strongly bonded to the heat spreader 3. The weld region can be transported to the outside of the cavity, namely, the outside of the semiconductor device 52 by evacuating the cavity from an air vent on the side opposite to a gate (resin inlet) with respect to the cavity.

A length of protrusion in which an edge portion of the insulating sheet portion 20 protrudes from the heat spreader 3 is determined by a rated capacity of the semiconductor device 52 and by a necessary creepage distance between the heat spreader 3 and the metal foil 20*b*. For example, there is no problem if the insulating sheet portion 20 has a length of protrusion of approximately 1.5 mm from the heat spreader 3 in the semiconductor device 52 having a rated capacity of 1200 V. The same also applies to the semiconductor device 51 in the first embodiment. For example, there is no problem if the insulating sheet portion 2 has a length of protrusion of approximately 1.5 mm from the heat spreader 3 in the semiconductor device 51 having a rated capacity of 1200 V.

(Second Aspect and Third Aspect (Using Insulating Sheet Portion 20 Before Being Processed))

In a second aspect and a third aspect, the step (b) is performed by using the insulating sheet portion 20 before being processed in the flat-plate structure having the same plane. Therefore, a bent portion forming process described below is performed as the step (c-1) included in the step (c).

The second and third aspects are predicated on that the transfer mold process is performed after the insulating sheet portion 20 before being processed and the mounted frame structure (including the heat spreader 3) are mounted in the cavity formed inside the dies in a positional relationship such that part of the insulating sheet portion 20 before being processed protrudes from the back surface of the heat spreader 3.

Figure 7:
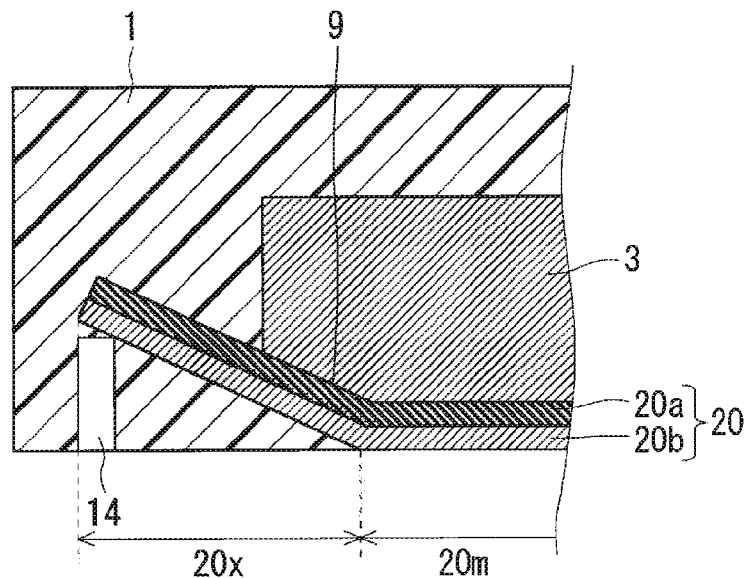
FIG. 7 is a cross-sectional view showing details of a bent portion forming process in a second aspect.
Figure 8:
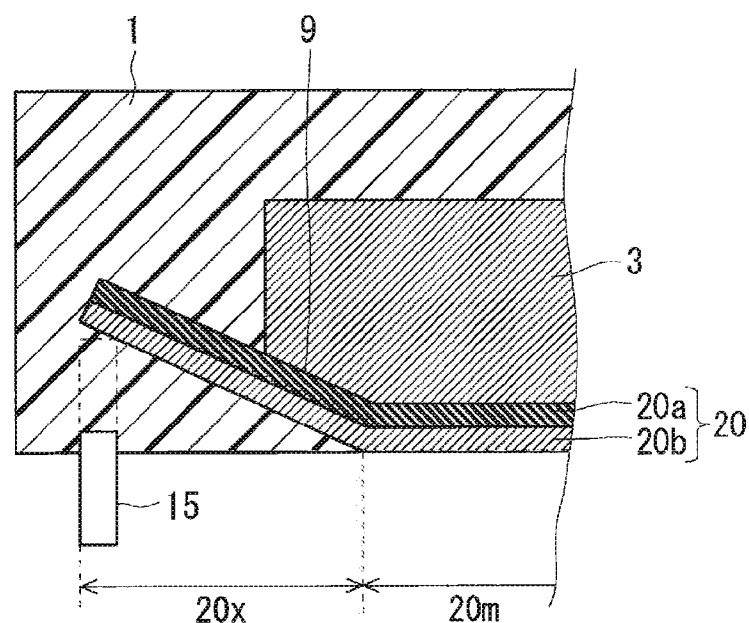
FIG. 8 is a cross-sectional view showing details of a bent portion forming process in a third aspect.

FIGS. 7 and 8 are cross-sectional views showing details of the bent portion forming process (second and third aspects). As shown in FIG. 7, in the second aspect, a fixed pin 14 that protrudes upwardly (+Z direction) is located on the lower die (not shown) for molding. Thus, when the heat spreader 3 and the insulating sheet portion 20 are housed in the cavity inside the upper die and the lower die for molding in the transfer mold process, a tip portion of the insulating sheet portion 20 is pressed upwardly by the fixed pin 14 such that the insulating layer 20*a* is closely bonded to the sagging surface 9 during mold clamping with the upper die and the lower die.

As a result, the tip portion of the insulating sheet portion 20 is bent, so that the bent portion 20*x* that is bent from the main body portion 20*m* so as to be closely bonded to the sagging surface 9 can be formed in the stage in which pressure is maintained after the completion of filling with the molding resin 1 at the latest. The molding resin 1 is cured after the bent portion 20*x* is formed, which can bond the insulating layer 20*a* in the bent portion 20*x* of the insulating sheet portion 20 to the sagging surface 9 of the heat spreader 3.

On the other hand, as in the third aspect shown in FIG. 8, a movable pin 15 may be provided instead of the fixed pin 14 shown in FIG. 7, the movable pin 15 protruding upwardly from the lower die (not shown) for molding while protruding, at least part of the movable pin 15 being housed in the lower die while being housed. In FIG. 8, the solid lines and the broken lines show the state in which the movable pin 15 is housed and the state in which the movable pin 15 protrudes, respectively.

For the third aspect, the movable pin 15 is changed from being housed to protruding after the heat spreader 3 and the insulating sheet portion 20 are housed in the cavity inside the upper die and the lower die for molding. Then, the tip portion of the insulating sheet portion 20 is pressed upwardly by the movable pin 15 while the movable pin 15 protrudes such that the insulating layer 20*a* is closely bonded to the sagging surface 9.

As a result, similarly to the second aspect, the bent portion 20*x* and the main body portion 20*m* are obtained, and the insulating layer 20*a* in the bent portion 20*x* of the insulating sheet portion 20 can be bonded to the sagging surface 9 of the heat spreader 3.

For the third aspect, in the stage of forming the bent portion 20*x*, the movable pin 15 is changed from protruding to being housed before the molding resin 1 is cured, and the movable pin 15 is preferably pulled out of the region in which the molding resin 1 is formed. The reason is that the movable pin 15 is housed in the lower die while being housed, that is to say, the tip portion of the movable pin 15 is lowered to the surface of the cavity, which does not allow a trace of a pin depth of the movable pin 15 to be left in the surface of the package of the molding resin 1 after the completion of the semiconductor device 52.

(Fourth Aspect (Using Insulating Sheet Portion 21 Before being Processed))

In a fourth aspect, the step (b) is performed by using the insulating sheet portion 21 before being processed in the flat-plate structure having the same plane. Then, a bent portion forming process described below is performed as the step (c-1) included in the step (c).

Figure 9:
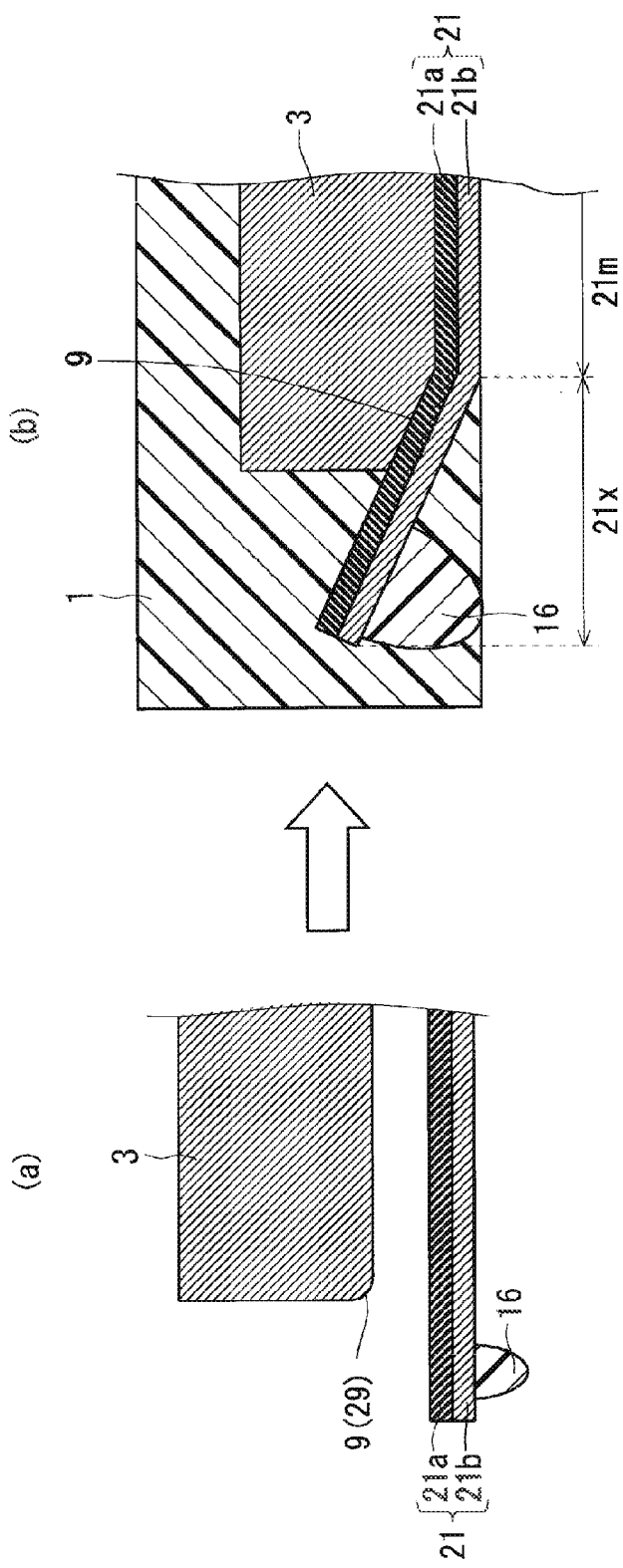
FIG. 9 is a cross-sectional view showing details of a bent portion forming process in a fourth aspect.

FIG. 9 is an explanatory diagram showing details of the bent portion forming process (fourth aspect). Part (a) of FIG. 9 is an explanatory diagram showing a relationship between the heat spreader 3 and the insulating sheet portion 21 before being processed in the step (b). Part (b) of FIG. 9 is a cross-sectional view showing a relationship between the heat spreader 3 and the insulating sheet portion 21 after being processed during the bent portion forming process performed as the step (c-1).

As shown in part (a) of FIG. 9, the step (b) prepares the insulating sheet portion 21 instead of the insulating sheet portion 20, the insulating sheet portion 21 having the laminated structure of the insulating layer 21*a* and the metal foil 21*b* (metal layer), the insulating layer 21*a* and the metal foil 21*b* except for a projection 16 having the same plane. In addition, the insulating sheet portion 21 is different from the insulating sheet portion 20 in that the insulating sheet portion 21 includes the projection 16 on the back surface of the tip portion of the metal foil 21*b*. A resin material that is excellent in processing properties, insulation properties, and adhesion properties is preferable to the projection 16.

The fourth aspect is predicated on that the transfer mold process is performed after the insulating sheet portion 21 before being processed and the mounted frame structure (including the heat spreader 3) are mounted in the cavity formed inside the dies in a positional relationship such that the surface of the insulating sheet portion 21 (insulating layer 21*a*) corresponding to the projection 16 protrudes from the back surface of the heat spreader 3.

As shown in part (b) of FIG. 9, in the fourth aspect, with the projection 16 on the back surface of the tip portion of the metal foil 21*b* of the insulating sheet portion 21, when the heat spreader 3 and the insulating sheet portion 21 are housed in the cavity inside the upper die and the lower die for molding in the transfer mold process, the tip portion of the insulating sheet portion 21 is pressed diagonally up to the right of the diagram by the projection 16 such that the insulating layer 21*a* is closely bonded to the sagging surface 9 during mold clamping with the upper die and the lower die.

As a result, the tip portion of the insulating sheet portion 21 is bent, so that the bent portion 21*x* that is bent from the main body portion 21*m* so as to be closely bonded to the sagging surface 9 can be formed in the stage in which pressure is maintained after the completion of filling with the molding resin 1 at the latest. The molding resin 1 is cured after the bent portion 21*x* is formed, which can bond the insulating layer 21a in the bent portion 21x of the insulating sheet portion 21 to the sagging surface 9 of the heat spreader 3.

(Fifth Aspect (Using Insulating Sheet Portion 20 Before being Processed))

In a fifth aspect, the step (b) is performed by using the insulating sheet portion 20 before being processed in the flat-plate structure having the same plane. Then, a bent portion forming process described below is performed as the step (c-1) included in the step (c).

The fifth aspect is predicated on that the transfer mold process is performed after the insulating sheet portion 20 before being processed and the mounted frame structure (including the heat spreader 3) are mounted in the cavity formed inside the dies in the positional relationship such that part of the insulating sheet portion 20 before being processed protrudes from the back surface of the heat spreader 3.

Figure 10:
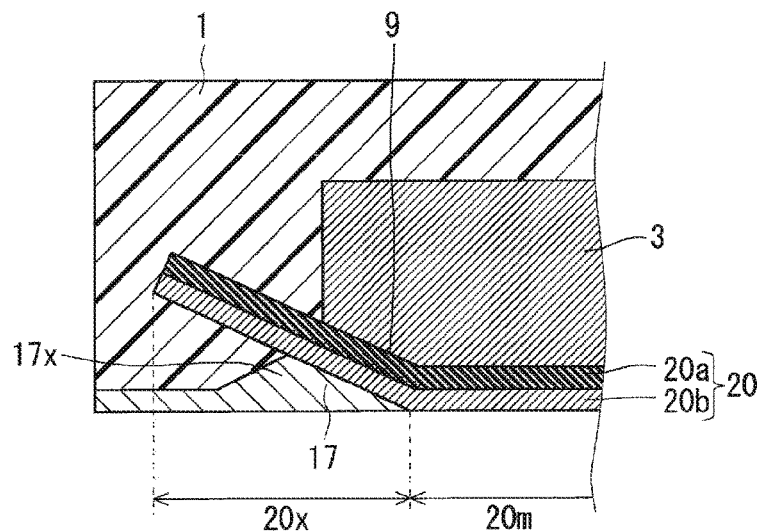
FIG. 10 is a cross-sectional view showing details of a bent portion forming process in a fifth aspect.

FIG. 10 is a cross-sectional view showing details of the bent portion forming process (fifth aspect). As shown in FIG. 10, the fifth aspect provides a projecting portion 17x on part of a surface of a lower die 17 for molding, to thereby provide a depression in the cavity being a region to which the molding resin 1 is injected, the cavity being formed of the upper die and the lower die 17. Thus, the heat spreader 3 and the insulating sheet portion 20 are housed in the cavity such that one oblique surface of the projecting portion 17x faces the sagging surface 9 in the transfer mold process, so that the tip portion of the insulating sheet portion 20 is pressed diagonally upward by the projecting portion 17x such that the insulating layer 20a is closely bonded to the sagging surface 9 during mold clamping with the upper die and the lower die.

As a result, the tip portion of the insulating sheet portion 20 is bent, so that the bent portion 20x that is bent from the main body portion 20m so as to be closely bonded to the sagging surface 9 can be formed in the stage in which pressure is maintained after the completion of filling with the molding resin 1 at the latest. The molding resin 1 is cured after the bent portion 20x is formed, which can bond the insulating layer 20a in the bent portion 20x of the insulating sheet portion 20 to the sagging surface 9 of the heat spreader 3.

For the sagging surface 9 as the chamfered portion, the projecting portion 17x of the lower die 17 for molding is provided with the one oblique surface such that an angle of the bent portion 20x of a bendable shape of the insulating sheet portion 20 to the main body portion 20m falls within the range of 10° to 15°. For the C surface 29 as the chamfered portion, the projecting portion 17x of the lower die 17 for molding is provided with the one oblique surface such that an angle of the bent portion 20x of a bendable shape of the insulating sheet portion 20 to the main body portion 20m is 45°.

(Sixth Aspect (Using Insulating Sheet Portion 22 after being Processed))

Figure 11:
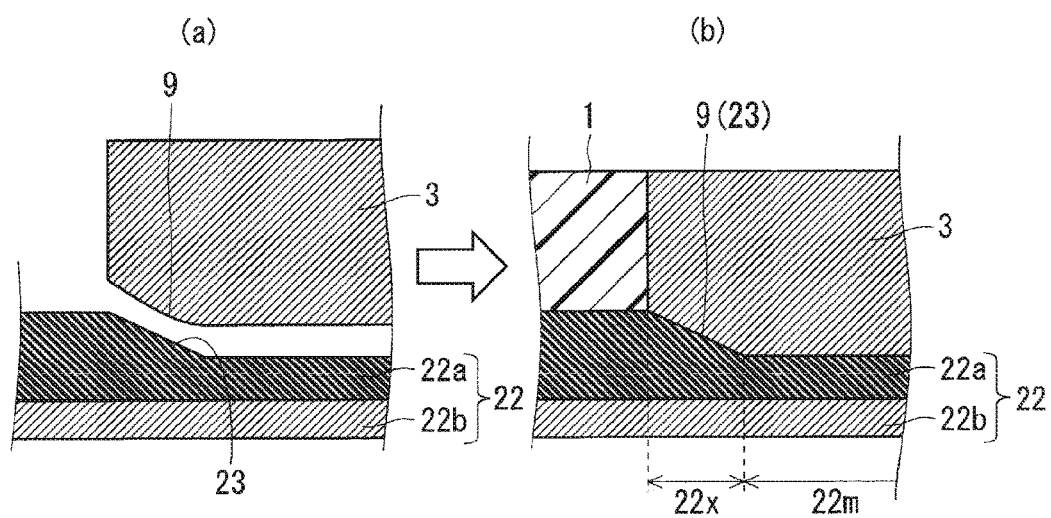
FIG. 11 is an explanatory diagram showing a relationship between an insulating sheet portion and a heat spreader provided in a sixth aspect.

FIG. 11 is an explanatory diagram showing a relationship between an insulating sheet portion 22 provided in a sixth aspect and the heat spreader 3. Part (a) of FIG. 11 is an explanatory diagram showing a relationship between the heat spreader 3 and the insulating sheet portion 22, and part (b) of FIG. 11 is a cross-sectional view showing details of the transfer mold process.

As shown in part (a) of FIG. 11, the sixth aspect is performed by using the insulating sheet portion 22 having the laminated structure of the insulating layer 22a and the metal foil 22b (metal layer). The insulating sheet portion 22 is different from the insulating sheet portion 20 in that the insulating layer 22a of the insulating sheet portion 22 has an inclined surface 23 of a shape capable of being closely bonded to the sagging surface 9 (C surface 29) of the heat spreader 3 and that the insulating layer 22a has a difference of altitude with different thicknesses on a lower portion side and a higher portion side of the inclined surface 23. Therefore, the insulating sheet portion 22 includes the region on the lower portion side as the main body portion 22m and the region on which the inclined surface 23 is formed as the bent portion 22x.

In this manner, in the sixth aspect, the step (b-1) in an early stage of the step (b) prepares the insulating sheet portion 22 after being processed in which the insulating layer 22a has the inclined surface 23 corresponding to the chamfered portion of the heat spreader 3 in advance. Therefore, the sixth aspect obtains the insulating sheet portion 22 after being processed without the bent portion forming process.

For the adoption of the sixth aspect, it is predicated on that the transfer mold process is performed after the insulating sheet portion 22 and the heat spreader 3 are mounted in the cavity formed inside the dies in a positional relationship such that the inclined surface 23 of the insulating layer 22a faces the chamfered portion (sagging surface 9, C surface 29) of the heat spreader 3. At this time, the surface of the insulating layer 22a on the lower portion side is closely bonded to the back surface of the heat spreader 3.

Therefore, in the transfer mold process performed in the step (c), as shown in part (b) of FIG. 11, the sagging surface 9 of the heat spreader 3 and the inclined surface 23 of the insulating layer 22a while being closely bonded to each other are housed in the cavity, and the molding resin 1 is cured after being injected. As a result, similarly to the first aspect, the insulating sheet portion 22 can be in the state of being strongly bonded to the heat spreader 3.

For the sagging surface 9 as the chamfered portion, the inclined surface 23 of the insulating layer 22a is provided such that the bent portion 22x of the insulating sheet portion 22 has a shape bent at an angle of 10° to 15° to the main body portion 22m. For the C surface 29 as the chamfered portion, the inclined surface 23 of the insulating layer 22a is provided such that the bent portion 22x of the insulating sheet portion 22 has a shape bent at an angle of 45° to the main body portion 22m.

In this manner, any of the first to sixth aspects is performed by using the insulating sheet portion 20 (21, 22) having the bent portion 20x (21x, 22x), and thus the semiconductor device 52 in the second embodiment having the structure in which the bent portion 20x is closely bonded to the chamfered portion (sagging surface 9, C surface 29) of the heat spreader 3 can be manufactured at a relatively low cost.

In addition, the first and the sixth aspects have obtained the insulating sheet portion 20 (22) after being processed in the stage of the step (b), so that the first and the sixth aspects may bond the insulating sheet portion 20 (22) to the heat spreader 3 before the transfer mold process in the step (c).

<Application>

Figure 12:
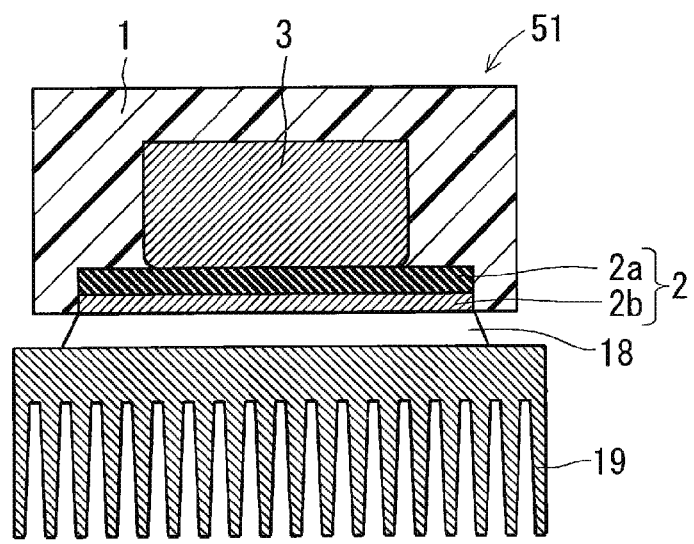
FIG. 12 is a cross-sectional view showing an application of the semiconductor device in the first embodiment.

FIG. 12 is a cross-sectional view showing an application of the semiconductor device 51 in the first embodiment. As shown in FIG. 12, the back surface of the metal foil 2b exposed from the molding resin 1 in the semiconductor device 51 is bonded to a cooling fin 19 with a solder 18 therebetween.

Figure 13:
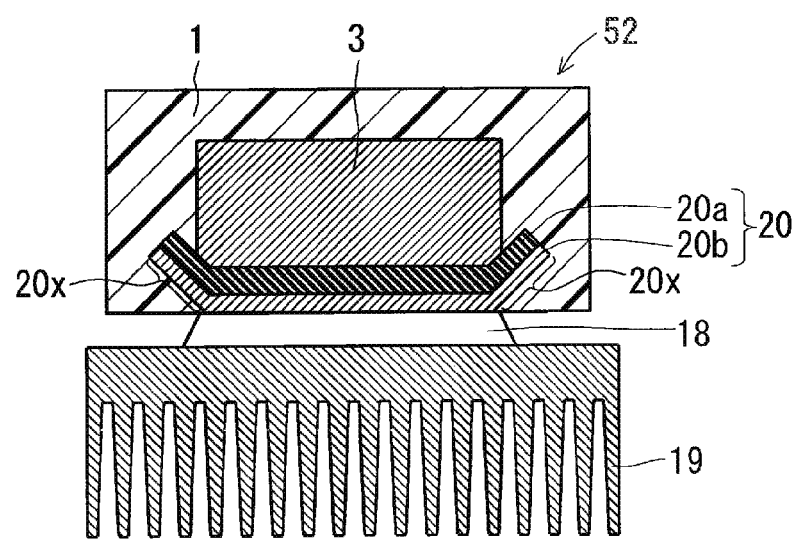
FIG. 13 is a cross-sectional view showing an application of the semiconductor device in the second embodiment.

FIG. 13 is a cross-sectional view showing an application of the semiconductor device 52 in the second embodiment.

As shown in FIG. 13, the back surface of the metal foil 20b exposed from the molding resin 1 in the semiconductor device 52 is bonded to a cooling fin 19 with a solder 18 therebetween. In addition, the insulating sheet portion 20 is shown in FIG. 13, but the insulating sheet portion 21 (see FIG. 9) or the insulating sheet portion 22 (see FIG. 11) may be used instead of the insulating sheet portion 20.

As shown in FIGS. 12 and 13, to bond the metal foil 2b (20b) and the cooling fin 19 without grease, a solder bonding with the solder 18 is applied. As described above, the peeling hardly occurs at the interface between the insulating layer 2a (20a) and the metal foil 2b (20b) and at the interface between the insulating sheet portion 2 (20) and the molding resin 1, so that the semiconductor devices 51, 52 have high reliability.

Power modules corresponding to the semiconductor devices 51, 52 have been mounted with grease, resulting in an increase in a heat resistance. On the other hand, as shown in FIGS. 12 and 13, the semiconductor devices 51, 52 have the high reliability of the devices per se by reducing the heat resistance between the heat spreader 3 and the molding resin 1, for example. For this reason, the cooling fin 19 is mounted by adopting the solder bonding, which can solve the increase in the heat resistance described above.

In this manner, the applications of the first embodiment and the second embodiment shown in FIGS. 12 and 13 can have effects of achieving the semiconductor device 51 (52) including the cooling fin 19 at a relatively low cost without adopting expensive grease in addition to an expensive high-heat-dissipation insulating sheet.

Moreover, using the insulating sheet portion 20 having the bent portion 20x increases the area of the bent portion 20x, which further increases the adhesion of the interface between the metal foil 20b and the molding resin 1, and thus the reliability of the device per se can be further improved.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood the numerous modifications and variations can be devised without departing from the scope of the invention.

DESCRIPTION OF NUMERALS 1 molding resin; 2, 20 to 22 insulating sheet portion; 2a, 20a to 22a insulating layer; 2b, 20b to 22b metal foil; 3 heat spreader; 4 power element; 6 signal terminal; 7 main terminal; 9 sagging surface; 10a upper die; 10b, 17 lower die; 12 filler; 13 void; 14 fixed pin; 15 movable pin; 16 projection; 18, 28 solder; 19 cooling fin.

The invention claimed is:

1. A semiconductor device having a structure in which a semiconductor element is sealed with a molding resin, said semiconductor device comprising:
   a heat spreader having a surface on which said semiconductor element is mounted; and
   an insulating sheet portion located on a back surface of said heat spreader, wherein
   said insulating sheet portion has a laminated structure of an insulating layer having a thermal conductivity higher than that of said molding resin and a metal layer, said insulating layer being closely bonded to the back surface of said heat spreader,
   said heat spreader has a chamfered portion obtained by R chamfering or C chamfering at an outer peripheral end portion of the back surface thereof,
   said insulating sheet portion has a main body portion and a bent portion, said main body portion forming a single plane along the back surface of said heat spreader, said bent portion having a surface region formed so as to be bent from said main body portion and being directly bonded to said chamfered portion, an edge portion of said insulating sheet portion protrudes from the heat spreader,
   said molding resin seals said semiconductor element, said heat spreader, and said insulating sheet portion except for a back surface of said metal layer in said main body portion, and
   said insulating sheet portion having said bent portion is formed so as to have a uniform thickness, and said bent portion is provided so that a projecting portion contacts a lower surface of said bent portion.

2. The semiconductor device according to claim 1, wherein
   said heat spreader has a thickness of 0.5 mm to 5 mm, and
   said chamfered portion has R set to 100 μm or more for the R chamfering and has C set to 100 μm or more for the C chamfering.

3. The semiconductor device according to claim 1, wherein said bent portion is bent at an angle in a range in which cracks do not occur in said insulating layer.

4. The semiconductor device according to claim 3, wherein said chamfered portion is obtained by the R chamfering, and said bent portion is bent at an angle in a range of 10 to 15° to said main body portion.

5. The semiconductor device according to claim 3, wherein said chamfered portion is obtained by the C chamfering, and said bent portion is bent at an angle of 45° to said main body portion.

6. A method for manufacturing the semiconductor device according to claim 1, comprising the steps of:
   (a) preparing said heat spreader having the surface on which said semiconductor element is mounted;
   (b) preparing said insulating sheet portion before being processed, said insulating sheet portion having the same plane as a whole; and
   (c) performing a transfer mold process of sealing, with said molding resin, said insulating sheet portion except for the back surface of said metal layer in said main body portion, said heat spreader, and said semiconductor element, wherein
   said step (a) includes the step (a-1) of performing a rupturing process with punching dies so as to form said chamfered portion at the outer peripheral end portion of the back surface of said heat spreader, and
   said step (c) includes the step (c-1) of performing a bent portion forming process of providing said main body portion and said bent portion by bending a region corresponding to said chamfered portion of said insulating sheet portion before being processed in such a manner that said chamfered portion is closely bonded to said bent portion.

* * * * *